US010677535B1

United States Patent
Kawabata et al.

(10) Patent No.: US 10,677,535 B1
(45) Date of Patent: Jun. 9, 2020

(54) HEAT SINK

(71) Applicant: FURUKAWA ELECTRIC CO., LTD., Tokyo (JP)

(72) Inventors: Kenya Kawabata, Tokyo (JP); Yasumi Sasaki, Tokyo (JP); Yosuke Watanabe, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/779,286

(22) Filed: Jan. 31, 2020

Related U.S. Application Data

(63) Continuation of application No. PCT/JP2019/045899, filed on Nov. 25, 2019.

(30) Foreign Application Priority Data

Nov. 30, 2018 (JP) .................................. 2018-225970

(51) Int. Cl.
*F28D 15/00* (2006.01)
*F28D 15/04* (2006.01)
(Continued)

(52) U.S. Cl.
CPC ......... *F28D 15/04* (2013.01); *F28D 15/0233* (2013.01); *F28D 15/0275* (2013.01); *F28F 2215/00* (2013.01); *H05K 7/20336* (2013.01)

(58) Field of Classification Search
CPC ......... F28D 15/0275; F28D 2021/0029; F28D 15/04; F28D 15/0233; F28F 2215/00; F28F 9/22
(Continued)

(56) References Cited

U.S. PATENT DOCUMENTS 4,830,100 A   5/1989   Kato et al.
6,843,307 B2   1/2005   Yuyama et al.
(Continued)

FOREIGN PATENT DOCUMENTS

JP   55-102889 A   8/1980
JP   61-149666 U   9/1986
(Continued)

OTHER PUBLICATIONS

International Search Report for PCT/JP2019/045899 (PCT/ISA/210) dated Dec. 24, 2019.
(Continued)

*Primary Examiner* — Claire E Rojohn, III
(74) *Attorney, Agent, or Firm* — Birch, Stewart, Kolasch & Birch, LLP

(57) ABSTRACT

An object of the present disclosure is to provide a heat sink that can equalize heat input in a heat receiving portion and increase a volume of the heat receiving portion, prevent an increase in heat resistance in the heat receiving portion even when a heat generation amount from a heat-generating element increases, and exhibit excellent cooling performance with respect to a cooling target.

There is provided a heat sink including: a heat transport member having a heat receiving portion thermally connected to a heat-generating element; a tube body connected to a heat insulating portion or a heat radiating portion of the heat transport member; and a heat radiation fin group which is thermally connected to the tube body and in which a plurality of heat radiation fins are arranged, in which the heat transport member has an integral internal space that communicates from the heat receiving portion to a connection portion with the tube body and is sealed with a working fluid, and the internal space of the heat transport member communicates with an internal space of the tube body.

8 Claims, 13 Drawing Sheets

(51) Int. Cl.
*F28D 15/02* (2006.01)
*H05K 7/20* (2006.01)

(58) Field of Classification Search
USPC .................................................. 165/104.26
See application file for complete search history.

(56) References Cited

U.S. PATENT DOCUMENTS

| | | | |
|---|---|---|---|
| 9,568,965 B2 | 2/2017 | Honmura et al. | |
| 10,126,069 B2* | 11/2018 | Sun | F28D 15/04 |
| 10,330,392 B2* | 6/2019 | Liu | F28D 15/046 |
| 10,371,458 B2* | 8/2019 | Sun | F28D 15/046 |
| 10,458,720 B2 | 10/2019 | Miura et al. | |
| 2002/0189793 A1* | 12/2002 | Noda | F28D 15/0233 165/104.26 |
| 2003/0178181 A1* | 9/2003 | Noda | F28F 3/02 165/80.3 |
| 2004/0069461 A1 | 4/2004 | Yuyama et al. | |
| 2005/0173098 A1* | 8/2005 | Connors | F28D 15/02 165/104.33 |
| 2006/0151153 A1* | 7/2006 | Chen | F28D 15/02 165/104.26 |
| 2007/0240859 A1 | 10/2007 | Wang et al. | |
| 2007/0272399 A1* | 11/2007 | Nitta | F28D 15/0233 165/185 |
| 2008/0144319 A1* | 6/2008 | Chang | B82Y 10/00 362/294 |
| 2011/0000649 A1* | 1/2011 | Joshi | H01L 23/427 165/104.26 |
| 2015/0119111 A1 | 4/2015 | Honmura et al. | |
| 2016/0245593 A1* | 8/2016 | Rice | F28D 15/046 |
| 2017/0176112 A1* | 6/2017 | Sarraf | F28D 15/02 |
| 2017/0307299 A1 | 10/2017 | Huang | |
| 2017/0330819 A1* | 11/2017 | Tao | F25B 39/00 |
| 2017/0356694 A1* | 12/2017 | Tan | F28D 15/0266 |
| 2017/0363367 A1* | 12/2017 | Yeh | F28D 15/0258 |
| 2018/0128552 A1 | 5/2018 | Ito et al. | |
| 2018/0172360 A1 | 6/2018 | Miura et al. | |
| 2018/0313611 A1 | 11/2018 | Sasaki | |
| 2019/0214695 A1* | 7/2019 | Miura | H01M 10/6556 |
| 2019/0271510 A1* | 9/2019 | Yang | F28F 21/081 |
| 2019/0271511 A1* | 9/2019 | Kishimoto | F28D 15/04 |
| 2019/0316848 A1* | 10/2019 | Tseng | F28D 15/025 |
| 2020/0049417 A1* | 2/2020 | Machida | H01L 23/427 |
| 2020/0049418 A1* | 2/2020 | Chu | F28D 15/0233 |

FOREIGN PATENT DOCUMENTS

| | | |
|---|---|---|
| JP | 62-89152 U | 6/1987 |
| JP | 2-154989 A | 6/1990 |
| JP | 2003-110072 A | 4/2003 |
| JP | 2004-125381 A | 4/2004 |
| JP | 2005-9728 A | 1/2005 |
| JP | 2009-532886 A | 9/2009 |
| JP | 2010-133686 A | 6/2010 |
| JP | 2013-130379 A | 7/2013 |
| JP | 2013-195001 A | 9/2013 |
| JP | 2015-88882 A | 5/2015 |
| JP | 2015-161448 A | 9/2015 |
| JP | 2016-9828 A | 1/2016 |
| JP | 2017-20742 A | 1/2017 |
| JP | 2017-198435 A | 11/2017 |
| JP | 2018-179487 A | 11/2018 |
| WO | WO 2007/115241 A2 | 10/2007 |
| WO | WO 2017/013761 A1 | 1/2017 |
| WO | WO 2017/115772 A1 | 7/2017 |
| WO | WO 2018/043312 A1 | 3/2018 |

OTHER PUBLICATIONS

Notice of Allowance dated Aug. 19, 2019 for the corresponding Japanese Application No. 2018-225970.
Notification of Reasons for refusal dated Jul. 8, 2019 for the corresponding Japanese Application No. 2018-225970.
Notification of Reasons for refusal dated May 8, 2019 for the corresponding Japanese Application No. 2018-225970.
Written Opinion of the International Searching Authority for PCT/JP2019/045899 (PCT/ISA/237) dated Dec. 24, 2019.

* cited by examiner

HEAT SINK

CROSS REFERENCE TO RELATED APPLICATIONS

The present application is a continuation application of International Patent Application No. PCT/JP2019/045899 filed on Nov. 25, 2019, which claims the benefit of Japanese Patent Application No. 2018-225970, filed on Nov. 30, 2018. The contents of these applications are incorporated herein by reference in their entirety.

BACKGROUND

Technical Field

The present disclosure relates to a heat sink that cools electrical and electronic components and the like, and more particularly, to a heat sink that can be installed in a narrow space.

Background

As electronic devices become more sophisticated, heat-generating elements, such as electronic components, are placed inside the electronic device with a high density. There is a case where a heat sink is used as means for cooling the heat-generating element, such as an electronic component. Generally, a heat sink (heat pipe type heat sink) having a tube-shaped heat pipe is used as the heat sink.

As a heat pipe type heat sink, there is, for example, a heat pipe type heat sink in which multiple plate-shaped heat radiation fins are provided so as to protrude to an outer peripheral surface of a plurality of tube-shaped heat pipes (Japanese Patent Application Publication No. 2003-110072). The heat sink of Japanese Patent Application Publication No. 2003-110072 is a heat sink formed such that the heat of a heat-generating element is transported to the heat radiation fins by a plurality of tube-shaped heat pipes and radiated from the heat radiation fins.

Meanwhile, in recent years, since heat-generating elements, such as electronic components, are placed with a high density, it is required to save a space for the heat sink. Moreover, a heat generation amount from the electronic component increases due to the high functionality of the electronic component or the like. Therefore, the heat sink is required to save a space and improve the cooling characteristics.

In a heat sink, such as the heat sink of Japanese Patent Application Publication No. 2003-110072 that transports the heat of the heat-generating element to the heat radiation fins by the plurality of heat pipes, in order to improve the cooling characteristics, a heat pipe group in which multiple heat pipes are arranged in parallel is formed, and it is necessary to thermally connect the heat pipe group to the heat-generating element. However, when the heat pipe group formed with the multiple heat pipes is thermally connected to the heat-generating element, a heat receiving amount of the heat pipe varies depending on a distance from the heat-generating element, and thus, there is a case where the heat is not sufficiently received by the heat pipes installed to be away from the heat-generating element. Since the heat of each heat pipe cannot be equally received, there is a case where sufficient cooling characteristics are not obtained. In addition, since a rounded portion is provided on an outer peripheral surface of each heat pipe and a void generated outside the Rounded portion does not contribute to the heat transport of the heat pipe group, a volume of the heat receiving portion of the heat pipe group cannot be sufficiently obtained, and there is a case where sufficient cooling characteristics cannot be exhibited.

Therefore, there is a case where a method for increasing the volume of the heat receiving portion of the heat pipe group by flattening the tube-shaped heat pipe and arranging flat portions of the heat pipe in parallel in a longitudinal direction is employed. However, when the flat portions of the heat pipes are arranged in parallel in the longitudinal direction, a heat receiving area of each heat pipe decreases, and thus, the heat resistance increases, and after all, there is a problem that sufficient cooling characteristics cannot be exhibited.

As described above, when the heat pipe group formed with the multiple heat pipes is thermally connected to the heat-generating element, the heat input in the heat receiving portion of the heat pipe group cannot be sufficiently equalized, the heat resistance between the heat receiving portion of the heat pipe group and the heat-generating element increases, and thus, there is a problem that sufficient cooling characteristics cannot be improved.

SUMMARY

Considering the situation, an object of the present disclosure is to provide a heat sink that can equalize heat input in a heat receiving portion and increase a volume of the heat receiving portion, prevent an increase in heat resistance in the heat receiving portion even when a heat generation amount from a heat-generating element increases, and exhibit excellent cooling performance with respect to a cooling target.

According to an aspect of the present disclosure, there is provided a heat sink including: a heat transport member having a heat receiving portion thermally connected to a heat-generating element; a tube body connected to a heat insulating portion or a heat radiating portion of the heat transport member; and a heat radiation fin group which are thermally connected to the tube body and in which a plurality of heat radiation fins are arranged, in which the heat transport member has an integral internal space that communicates from the heat receiving portion to a connection portion with the tube body and is sealed with a working fluid, and the internal space of the heat transport member communicates with an internal space of the tube body.

In the aspect, in the heat transport member, the part thermally connected to the heat-generating element which is a cooling target functions as a heat receiving portion, and the part connected to the tube body functions as a heat insulating portion or a heat radiating portion of the heat transport member. Therefore, in the heat sink according to the aspect of the present disclosure, the heat transport member transports the heat of the heat-generating element from the heat receiving portion to the tube body. In addition, a working fluid that has changed in phase to a gas phase when the heat transport member receives the heat from the heat-generating element flows from the heat transport member to the tube body. When the gas-phase working fluid flows from the heat transport member to the tube body, the tube body receives the heat from the heat transport member and further transports the heat received from the heat transport member to the heat radiation fin group. The heat transported from the tube body to the heat radiation fin group is released from the heat radiation fin group to the external environment of the heat sink.

In the heat sink according to the aspect of the present disclosure, the tube body extends along an arrangement direction of the heat radiation fins.

In the heat sink according to the aspect of the present disclosure, an extending direction of the tube body is not parallel to a heat transport direction of the heat transport member.

In the heat sink according to the aspect of the present disclosure, a plurality of the tube bodies are provided and extend from the heat transport member in a plurality of directions. In addition, "extending in a plurality of directions" means extending in a plurality of different directions with respect to the heat transport direction of the heat transport member.

In the heat sink according to the aspect of the present disclosure, an extending direction of the tube body is parallel to a heat transport direction of the heat transport member.

In the heat sink according to the aspect of the present disclosure, a dimension in a width direction of the heat transport member in the heat receiving portion is larger than a dimension in the width direction of the heat transport member at a part to which the tube body is connected.

In the present specification, "width direction of the heat transport member" means a direction orthogonal to the heat transport direction of the heat transport member.

In the heat sink according to the aspect of the present disclosure, at least one surface of the heat transport member has a planar shape.

In the heat sink according to the aspect of the present disclosure, the heat receiving portion of the heat transport member has a flat shape.

In the heat sink according to the aspect of the present disclosure, a wick structure provided on the heat transport member is connected to a wick structure provided in the tube body via a connection member.

In the heat sink according to the aspect of the present disclosure, the connection member is a wick member having a capillary force.

In the aspect of the heat sink of the present disclosure, the internal space of the heat transport member having the heat receiving portion is different from the internal space of the heat pipe group in which the plurality of heat pipes are arranged in parallel, and the entire space is integrated in a communicating manner. Accordingly, according to the aspect of the heat sink of the present disclosure in which the heat transport member transports the heat of the heat-generating element from the heat receiving portion to the connection portion with the tube body thermally connected to the heat radiation fin, even when the heat generation amount from the heat-generating element increases, that is, even when the heat receiving amount in the heat receiving portion increases, it is possible to equalize the heat input in the heat receiving portion and increase the volume of the heat receiving portion, and to prevent an increase in heat resistance in the heat receiving portion, and thus, it is possible to exhibit excellent cooling performance with respect to the cooling target. In addition, since the entire internal space of the heat transport member is integrated in a communicating manner, the entire heat-generating element can be uniformly cooled even when heating unevenness occurs in the heat-generating element.

Further, according to the aspect of the heat sink of the present disclosure, since the heat transport member transports the heat of the heat-generating element from the heat receiving portion to the tube body thermally connected to the heat radiation fin, while considering the dimension of the heat-generating element and the space dimension in which the heat sink is installed, it is possible to select the dimensions of the heat receiving portion and the heat insulating portion of the heat transport member, and thus, the degree of freedom in design is improved.

According to the aspect of the heat sink of the present disclosure, the tube body that communicates with the internal space of the heat transport member extends along the arrangement direction of the heat radiation fins, and accordingly, the gas-phase working fluid flows along the arrangement direction of the heat radiation fin inside the tube body. Therefore, the fin efficiency of the heat radiation fin group is improved, and the cooling performance of the heat sink is improved.

According to the aspect of the heat sink of the present disclosure, since the extending direction of the tube body is not parallel to the heat transport direction of the heat transport member, the heat transported from the heat transport member is transported in a direction different from the extending direction of the heat transport member. Therefore, it is possible to prevent an increase in dimension of the heat sink in the extending direction (heat transport direction) of the heat transport member, and to save a space.

According to the aspect of the heat sink of the present disclosure, since the plurality of tube bodies extend from the heat transport member in a plurality of directions, the heat transported from the heat transport member is transported in a plurality of directions different from the extending direction of the heat transport member. Therefore, it is possible to more reliably prevent an increase in dimension of the heat sink in the extending direction of the heat transport member.

According to the aspect of the heat sink of the present disclosure, since the extending direction of the tube body is parallel to the heat transport direction of the heat transport member, the heat transported from the heat transport member is transported in a direction the same as the extending direction of the heat transport member. Therefore, it is possible to prevent an increase in dimension of the heat sink in directions other than the extending direction (heat transport direction) of the heat transport member.

According to the aspect of the heat sink of the present disclosure, the wick structure provided in the heat transport member is connected to the wick structure provided in the tube body via the connection member, and accordingly, the working fluid that has changed in phase to a liquid phase inside the tube body can smoothly circulate from the tube body to the heat transport member. Accordingly, since the flow characteristics of the working fluid are improved, the cooling performance of the heat sink is improved.

DETAILED DESCRIPTION

Figure 1:
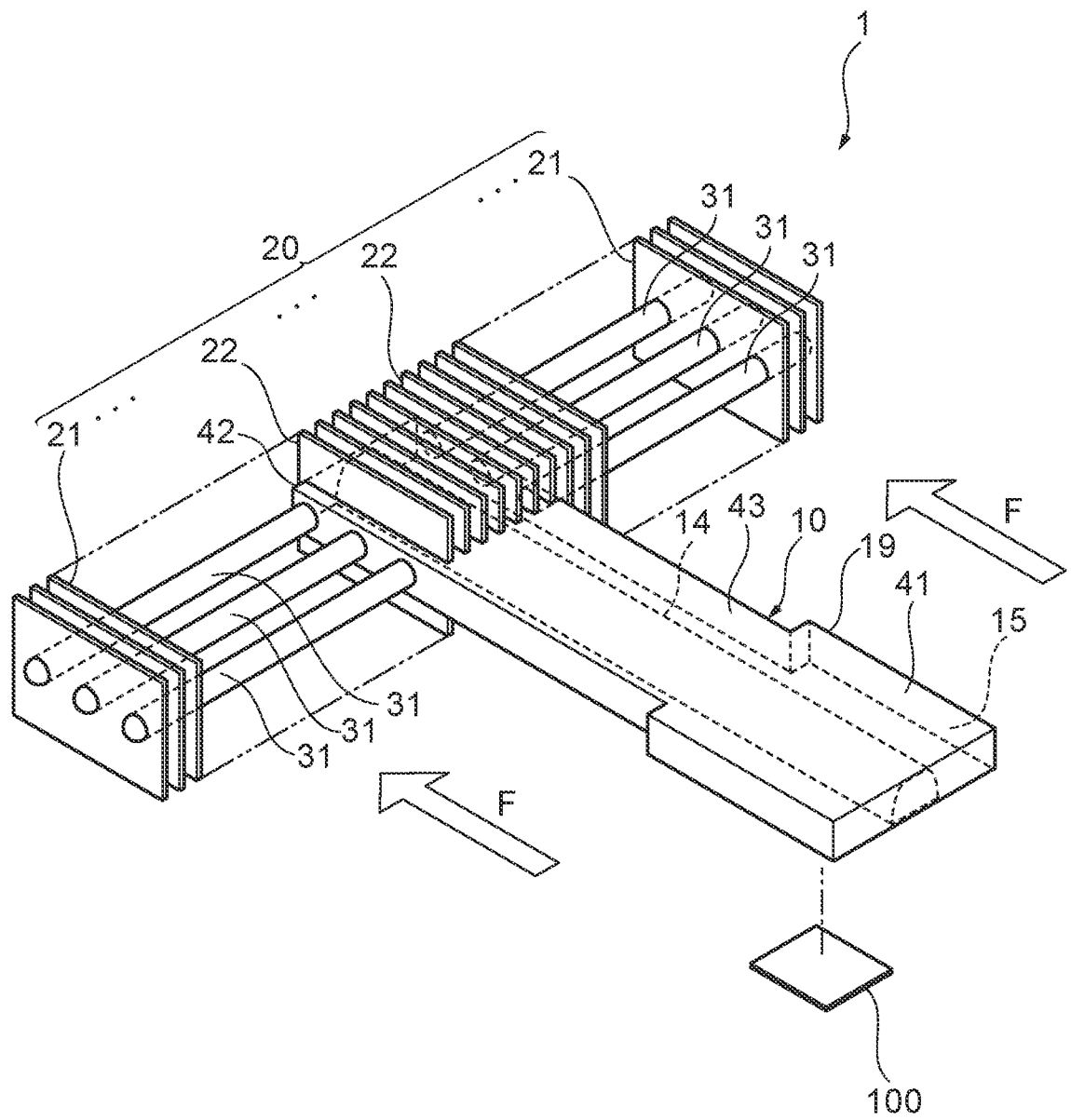
FIG. 1 is a perspective view for describing an outline of a heat sink according to a first embodiment of the present disclosure.
Figure 2:
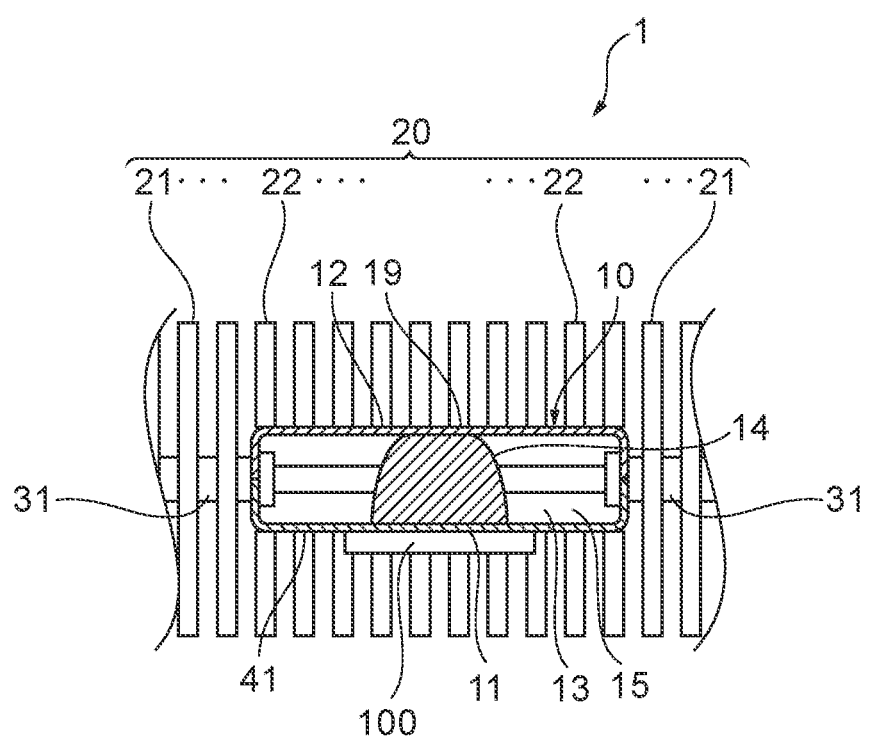
FIG. 2 is a sectional view for describing an outline of the heat sink according to the first embodiment of the present disclosure.
Figure 3:
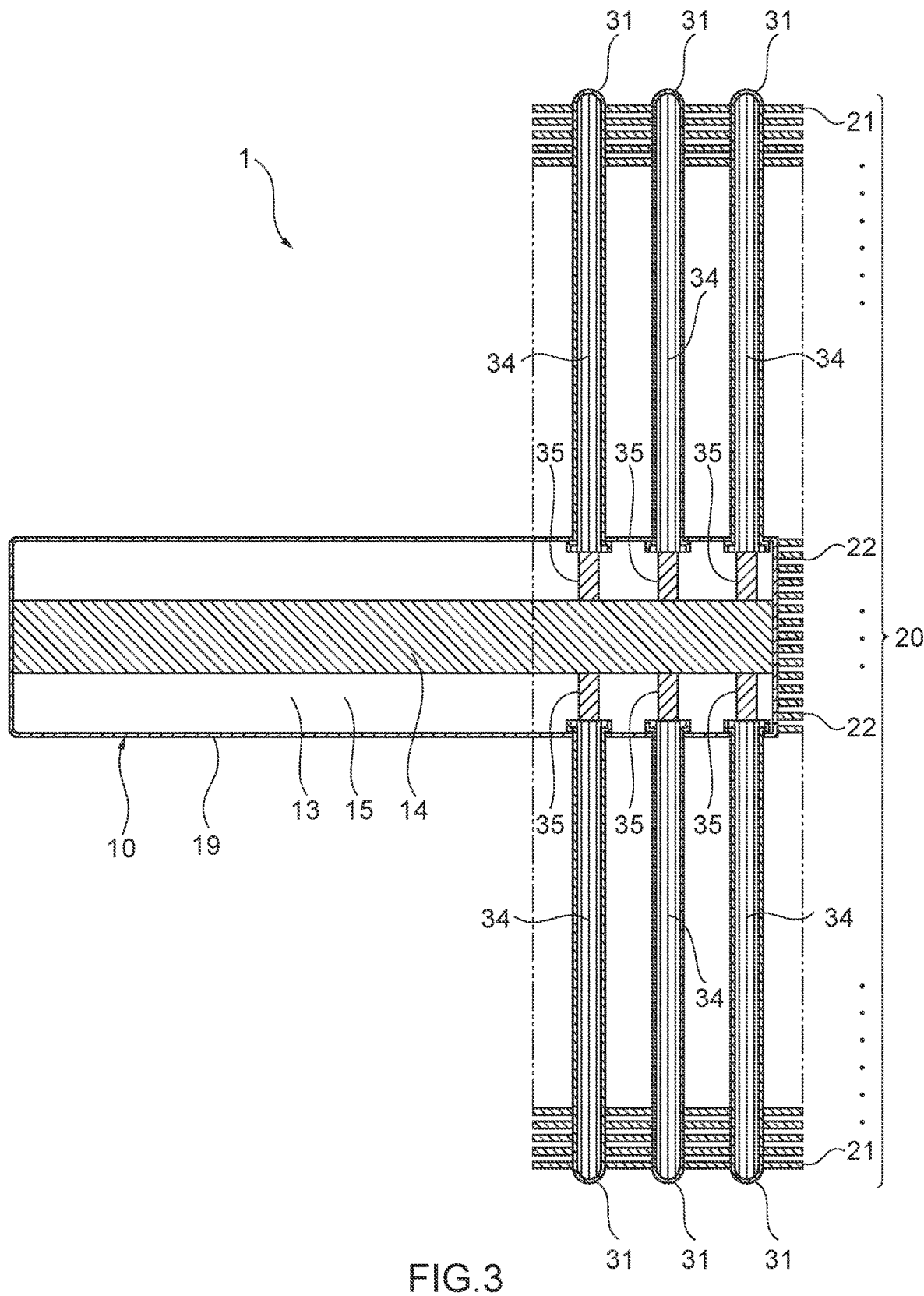
FIG. 3 is an explanatory view illustrating an outline of a connection portion between a heat transport member and a tube body of the heat sink according to the first embodiment of the present disclosure.
Figure 4:
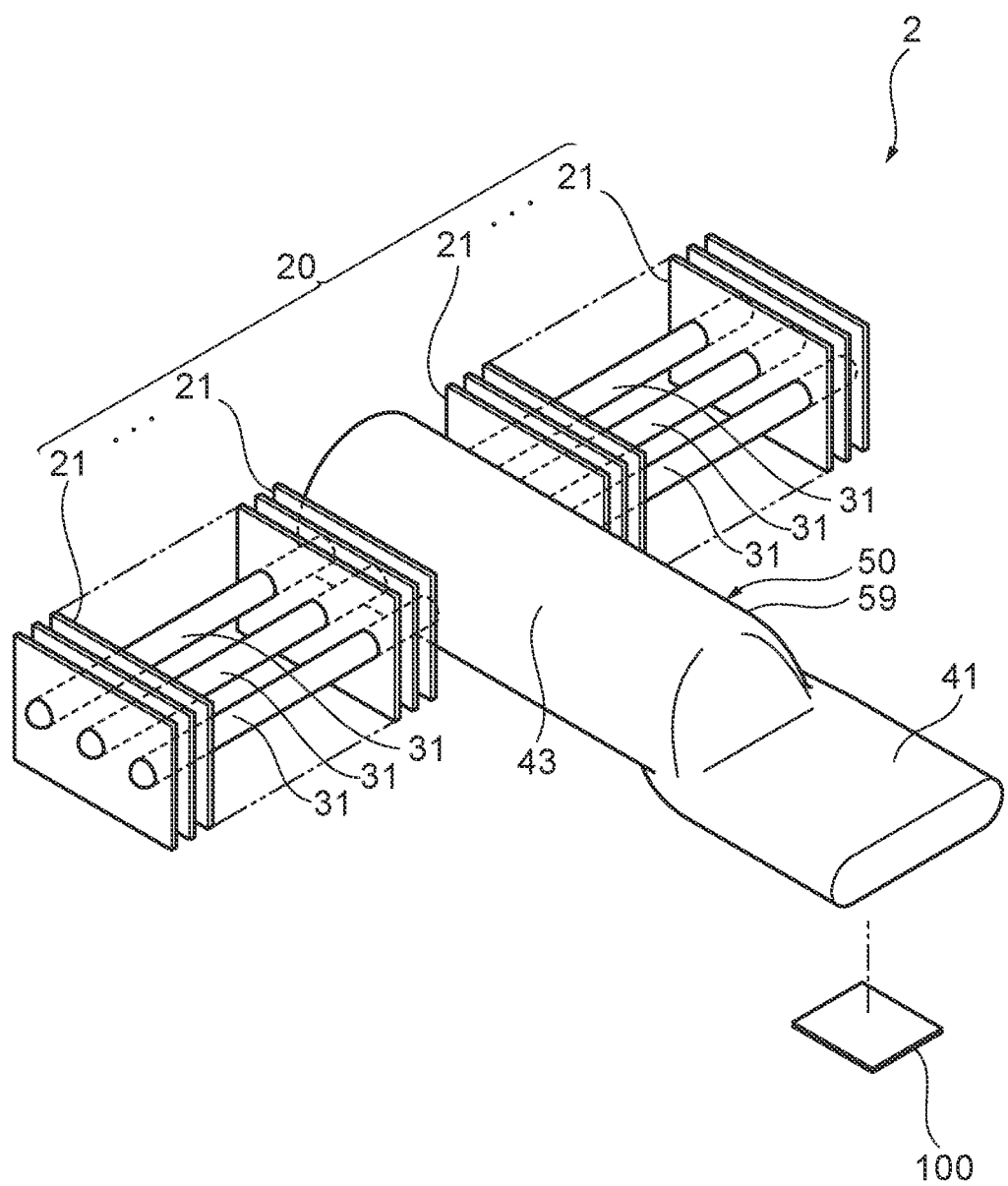
FIG. 4 is a perspective view for describing an outline of a heat sink according to a second embodiment of the present disclosure.
Figure 5:
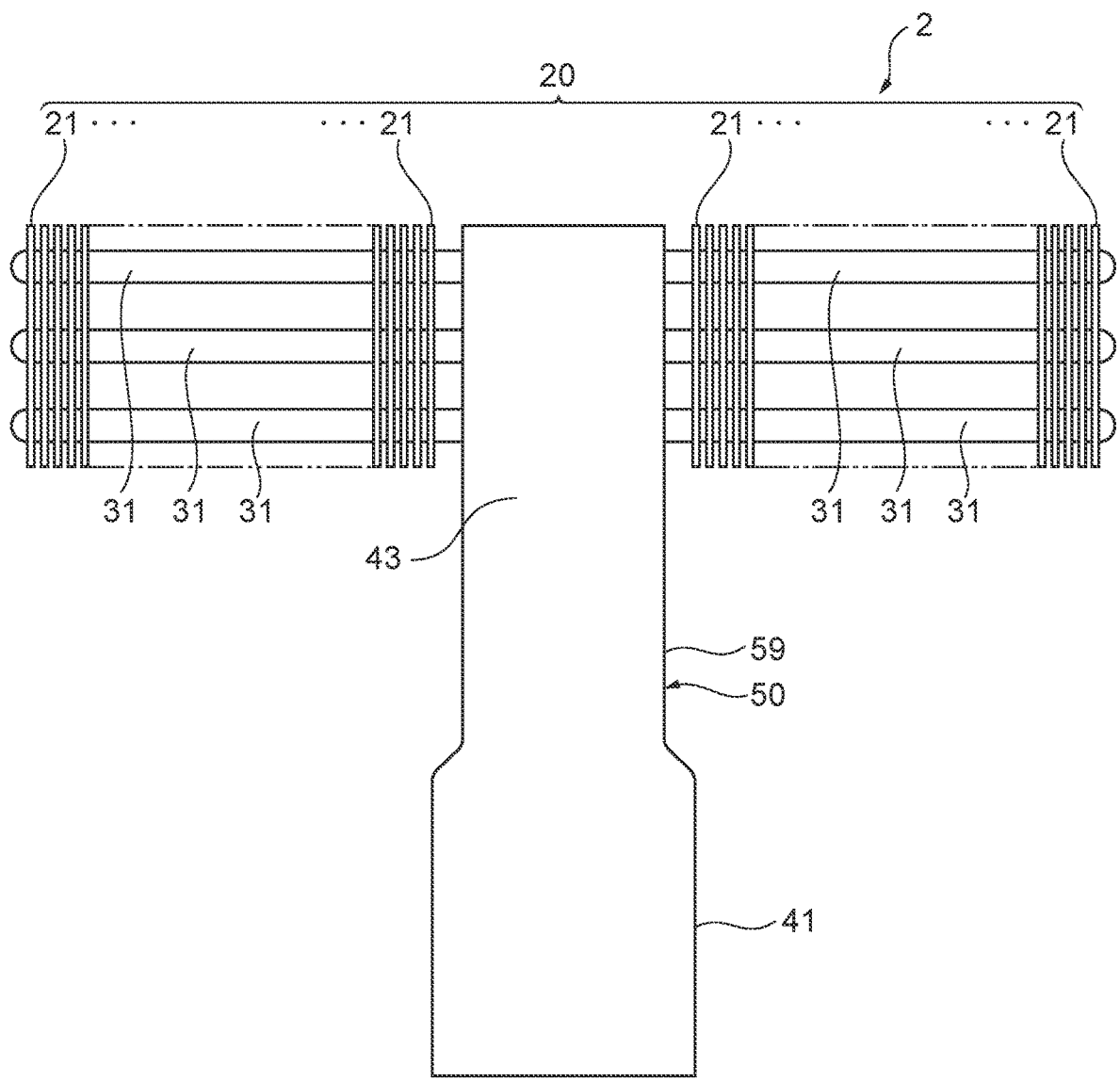
FIG. 5 is a plan view for describing an outline of the heat sink according to the second embodiment of the present disclosure.
Figure 6:
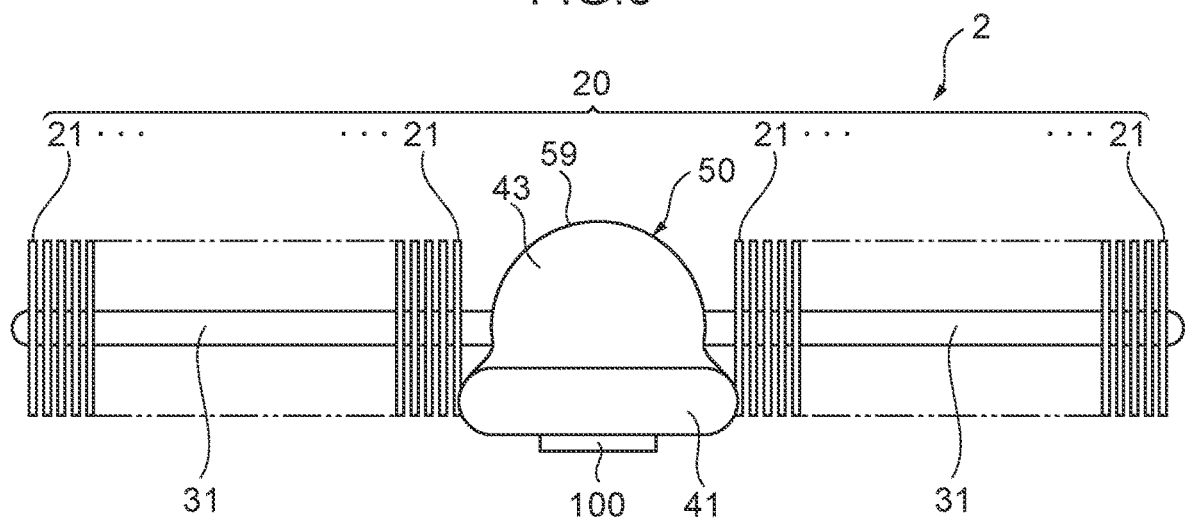
FIG. 6 is a front view for describing an outline of the heat sink according to the second embodiment of the present disclosure.
Figure 7:
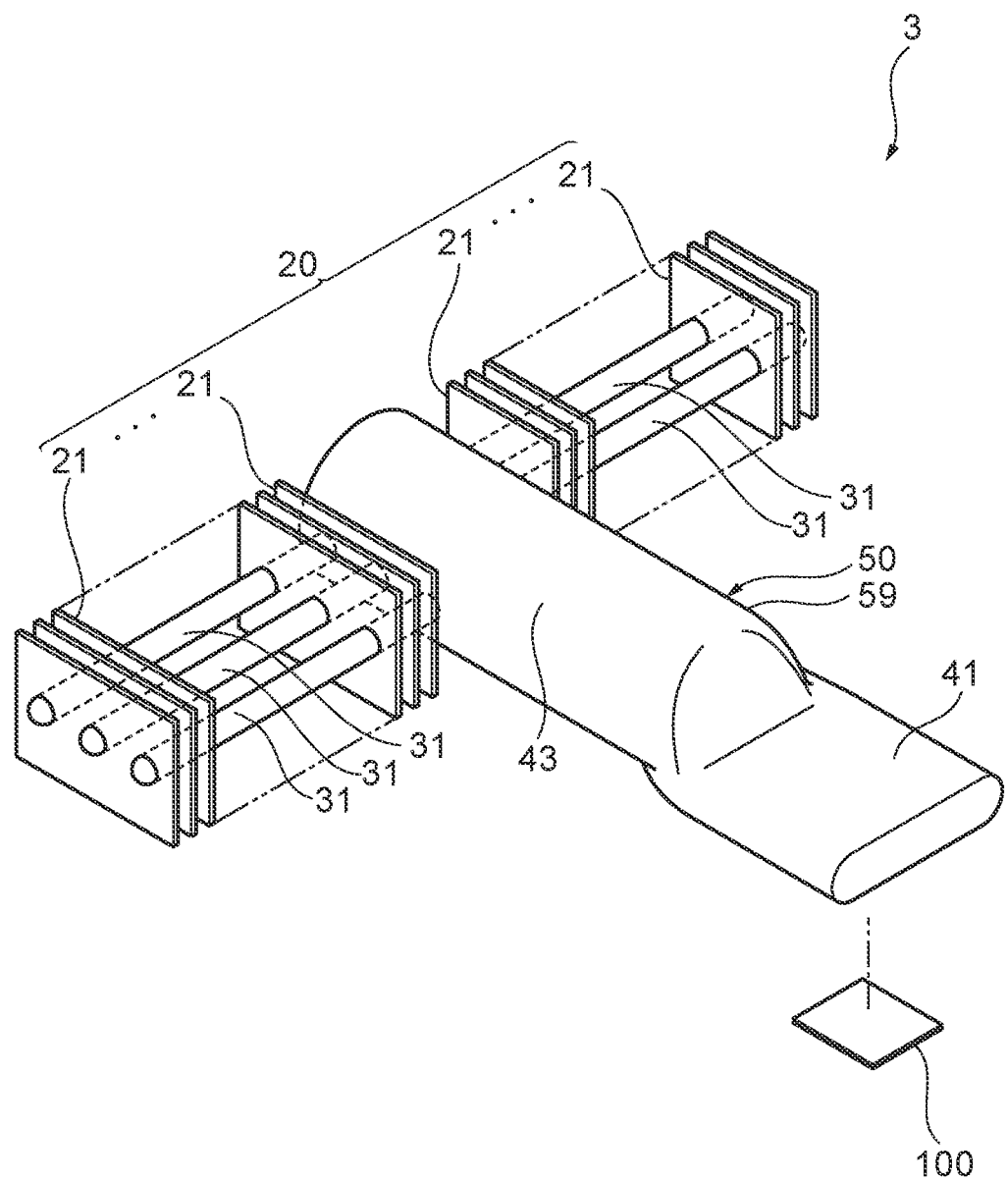
FIG. 7 is a perspective view for describing an outline of a heat sink according to a third embodiment of the present disclosure.
Figure 8:
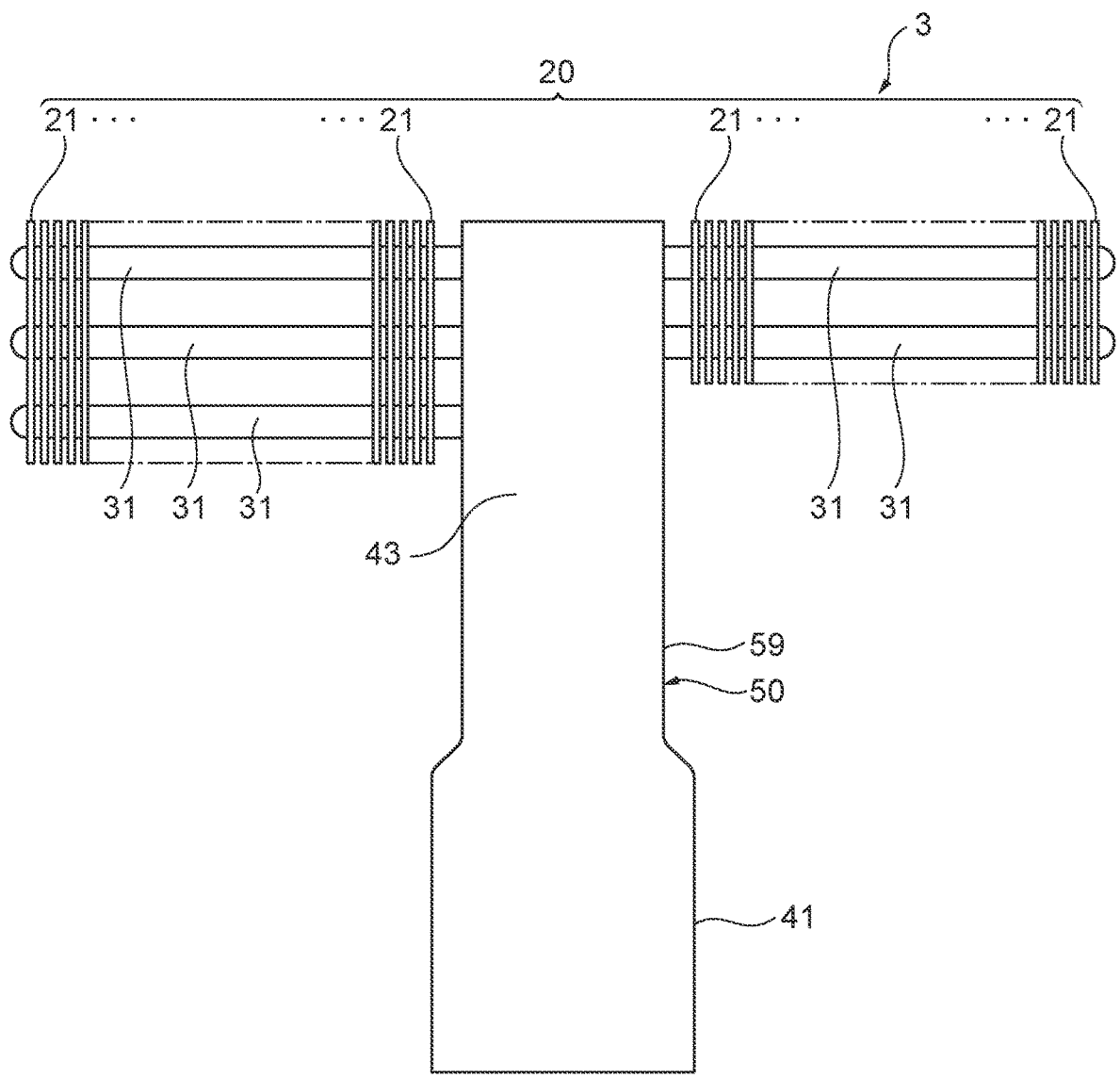
FIG. 8 is a plan view for describing an outline of the heat sink according to the third embodiment of the present disclosure.
Figure 9:
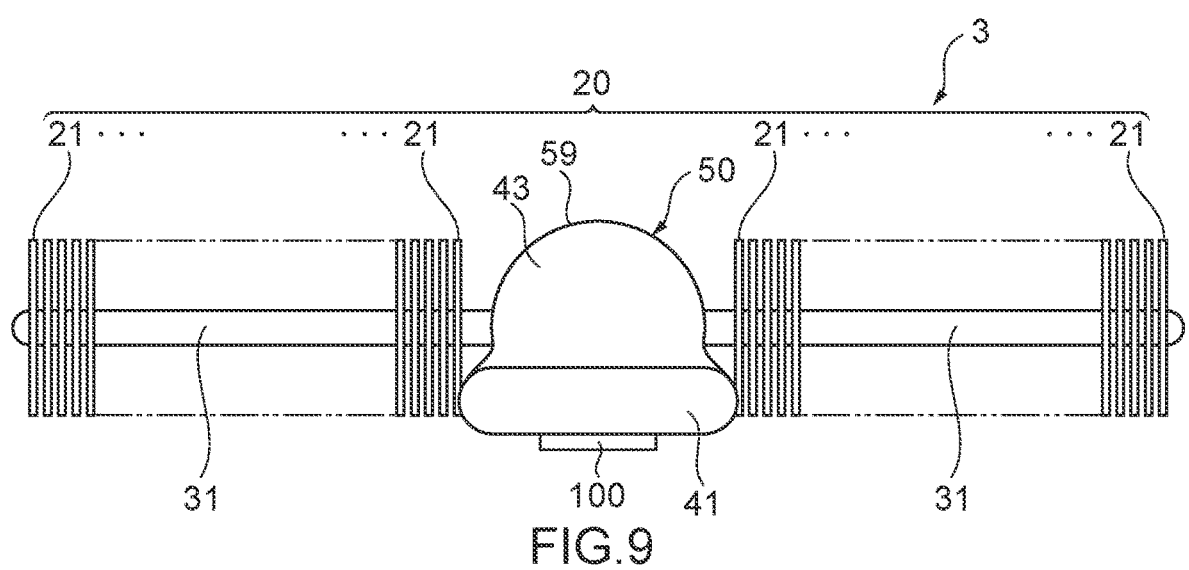
FIG. 9 is a front view for describing an outline of the heat sink according to the third embodiment of the present disclosure.
Figure 10:
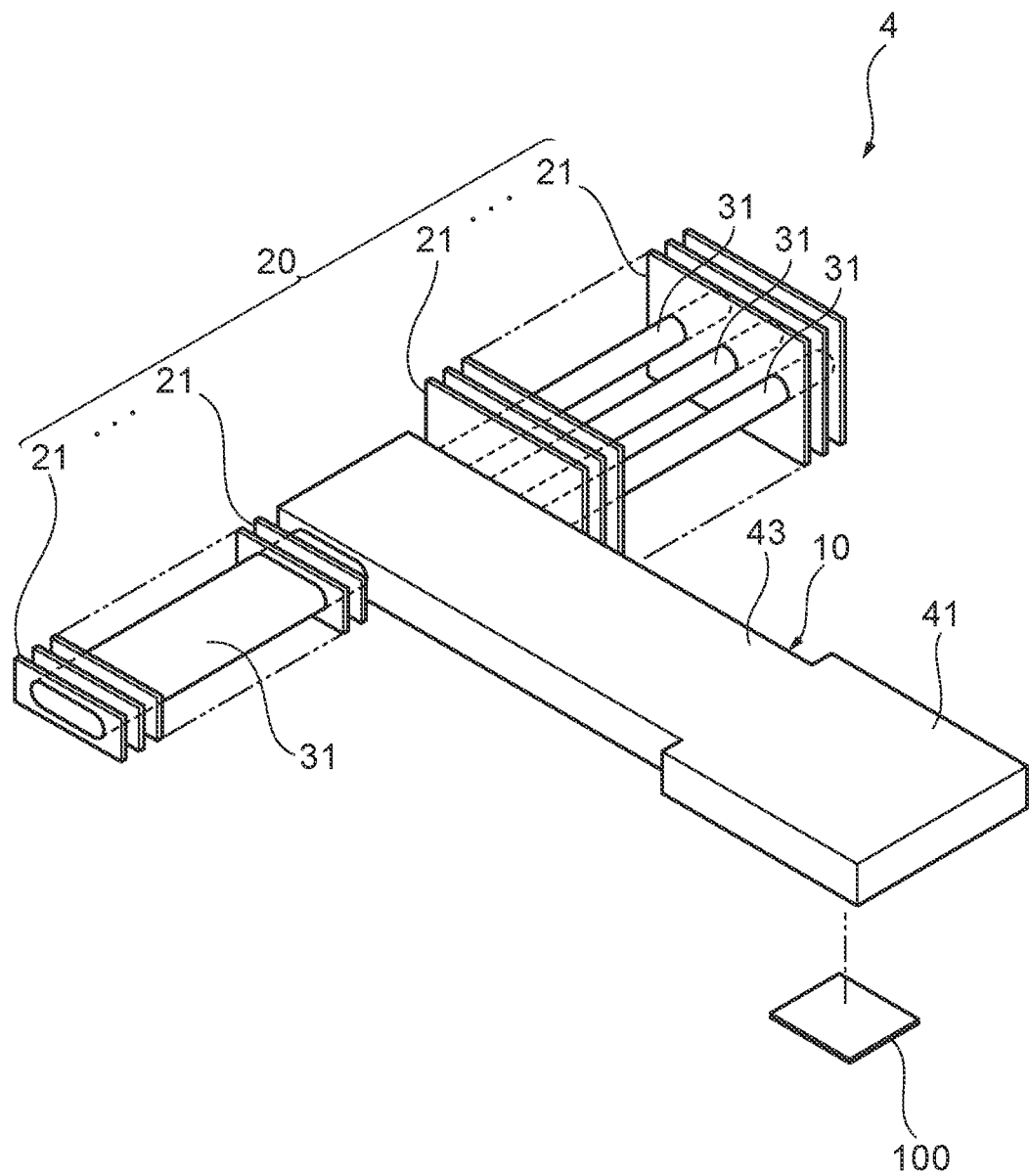
FIG. 10 is a perspective view for describing an outline of a heat sink according to a fourth embodiment of the present disclosure.
Figure 11:
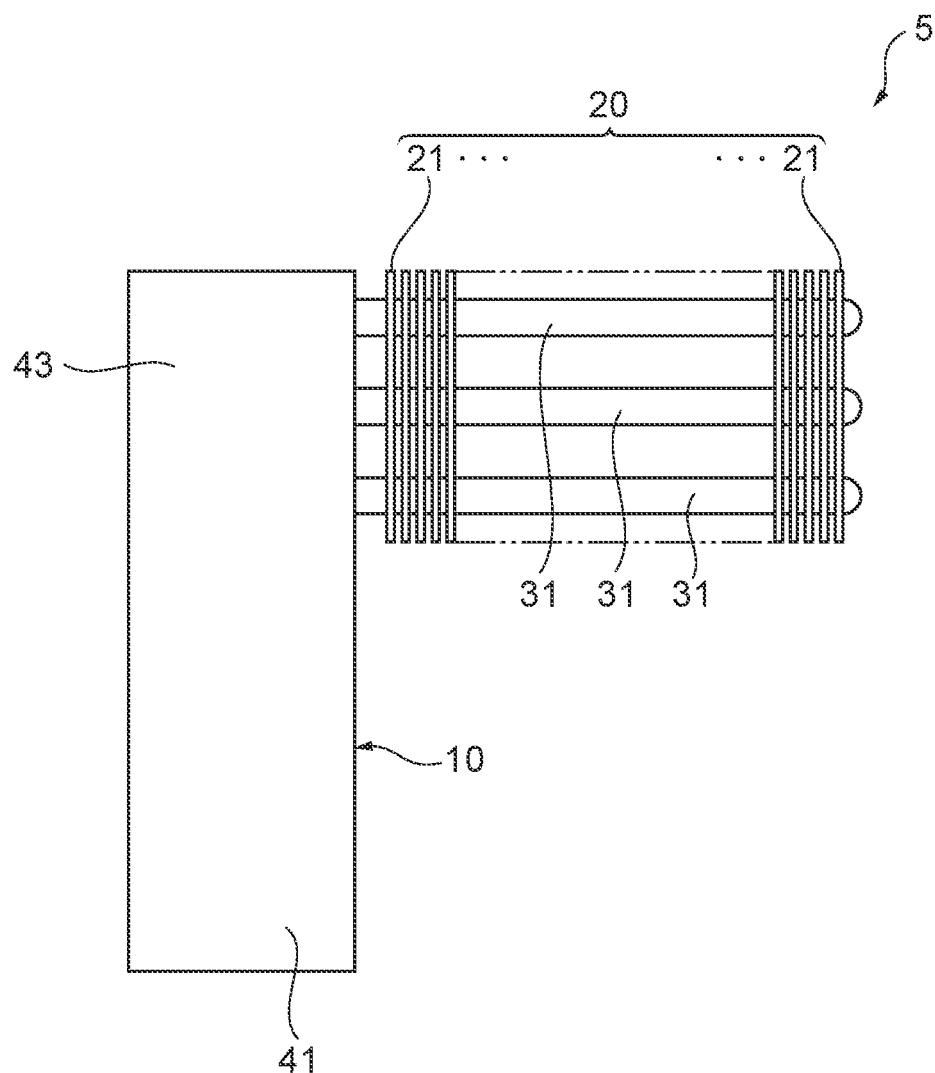
FIG. 11 is a plan view for describing an outline of a heat sink according to a fifth embodiment of the present disclosure.
Figure 12:
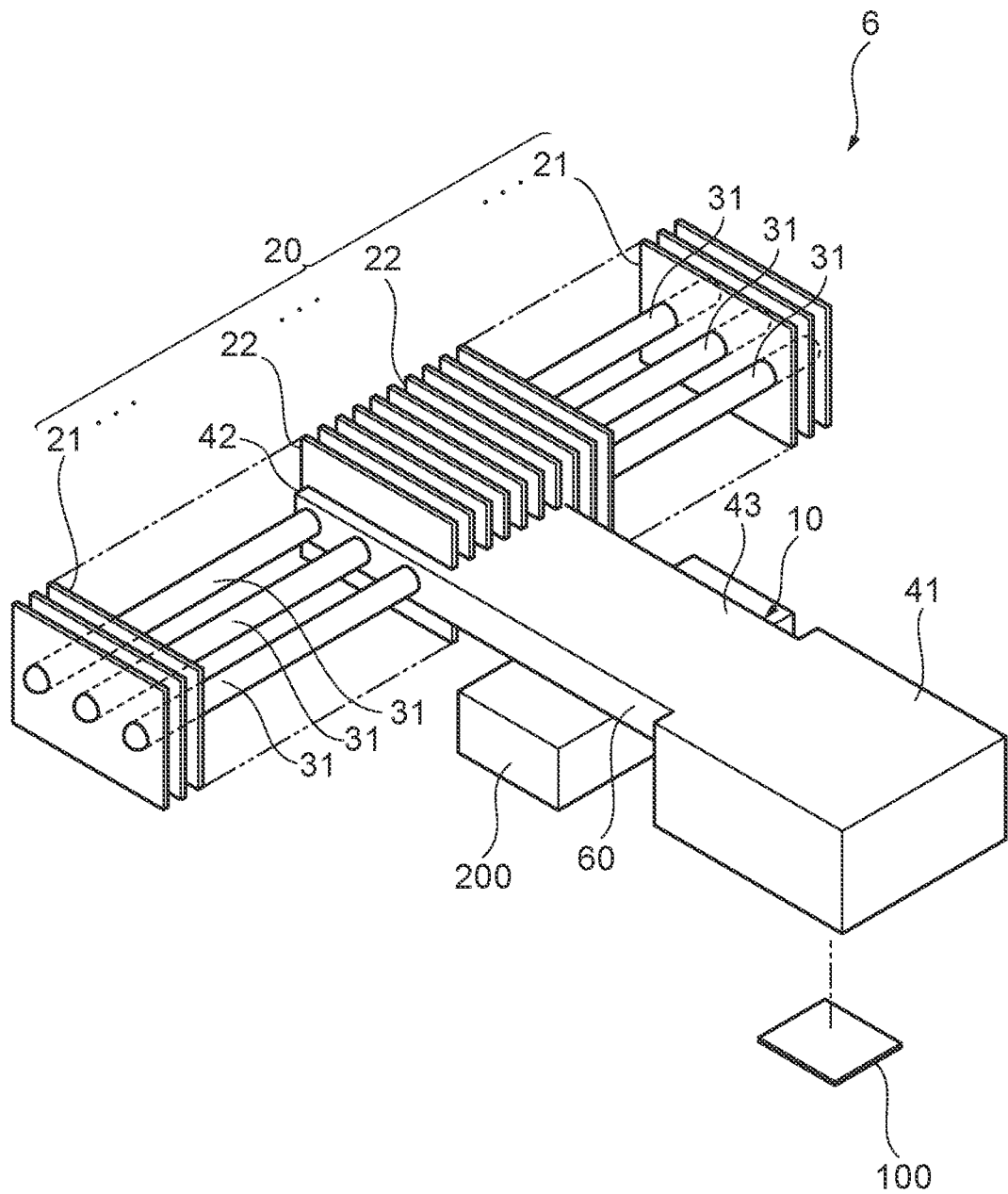
FIG. 12 is a plan view for describing an outline of a heat sink according to a sixth embodiment of the present disclosure.
Figure 13:
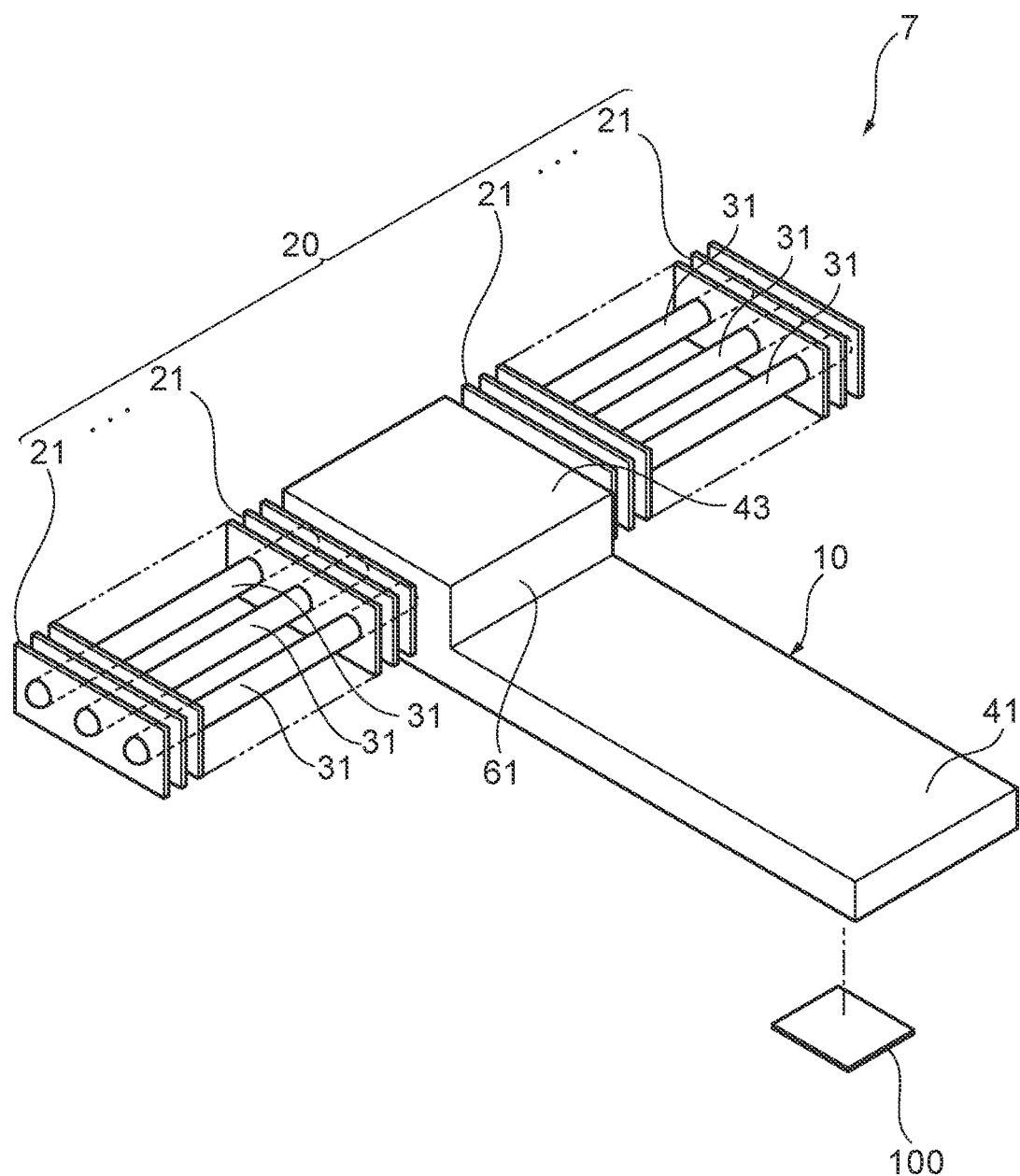
FIG. 13 is a plan view for describing an outline of a heat sink according to a seventh embodiment of the present disclosure.
Figure 14:
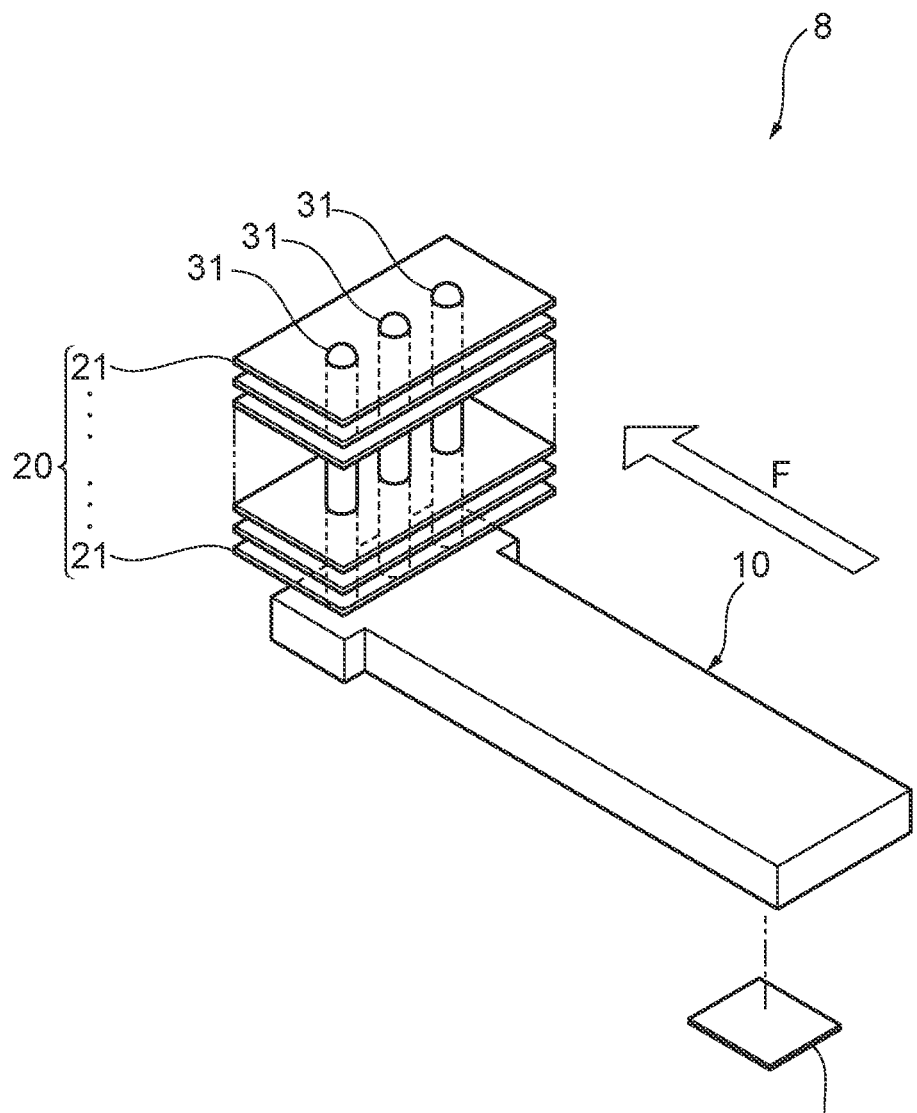
FIG. 14 is a plan view for describing an outline of a heat sink according to an eighth embodiment of the present disclosure.
Figure 15:
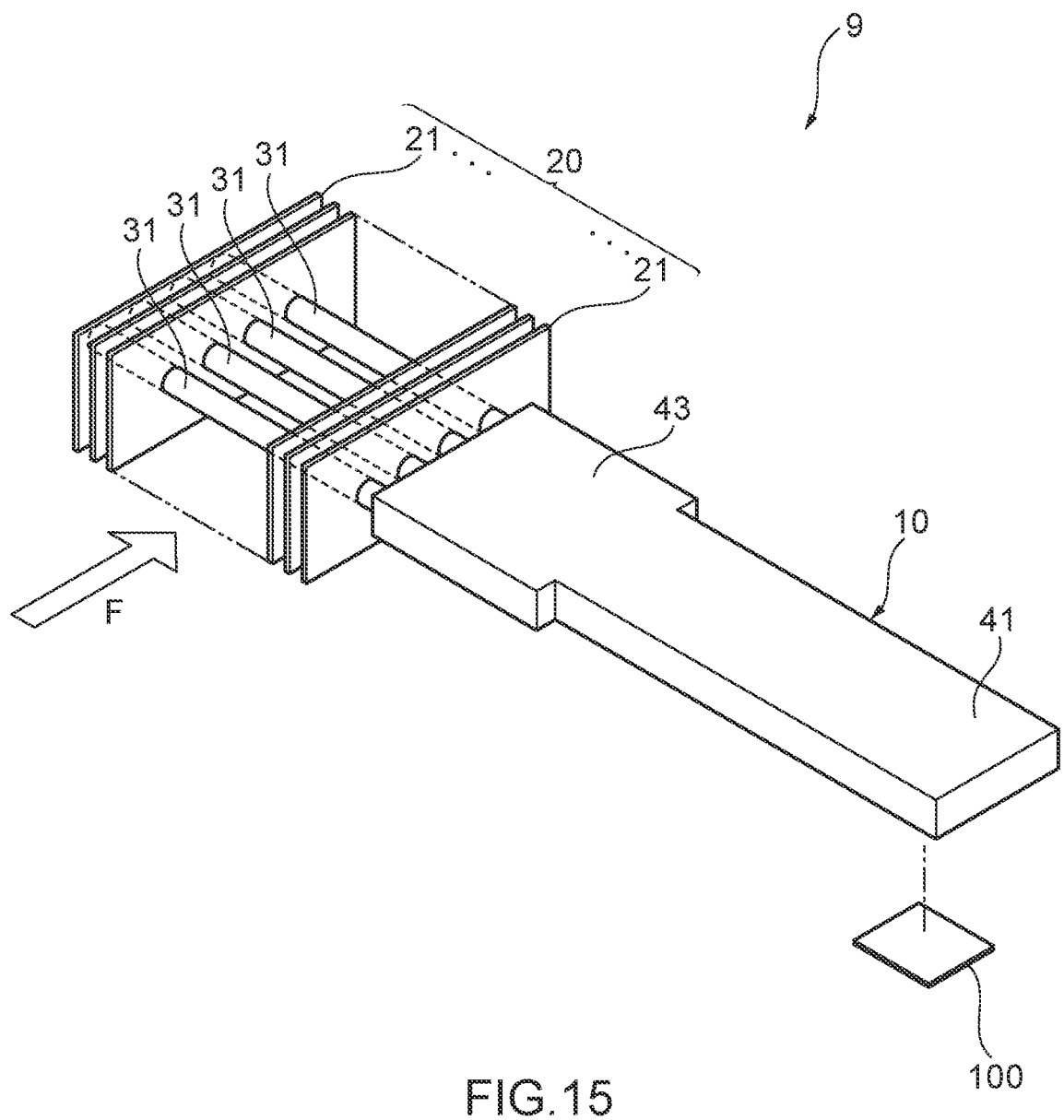
FIG. 15 is a plan view for describing an outline of a heat sink according to an ninth embodiment of the present disclosure.

Hereinafter, a heat sink according to embodiments of the present disclosure will be described with reference to the drawings. FIG. 1 is a perspective view for describing an outline of the heat sink according to an embodiment of the present disclosure. FIG. 2 is a sectional view for describing an outline of the heat sink according to the embodiment of the present disclosure. FIG. 3 is an explanatory view illustrating an outline of a connection portion between a heat transport member and a tube body of the heat sink according to the embodiment of the present disclosure. FIG. 4 is a perspective view for describing an outline of the heat sink according to a second embodiment of the present disclosure. FIG. 5 is a plan view for describing an outline of the heat sink according to the second embodiment of the present disclosure. FIG. 6 is a front view for describing an outline of the heat sink according to the second embodiment of the present disclosure. FIG. 7 is a perspective view for describing an outline of the heat sink according to a third embodiment of the present disclosure. FIG. 8 is a plan view for describing an outline of the heat sink according to the third embodiment of the present disclosure. FIG. 9 is a front view for describing an outline of the heat sink according to the third embodiment of the present disclosure. FIG. 10 is a perspective view for describing an outline of the heat sink according to a fourth embodiment of the present disclosure. FIG. 11 is a plan view for describing an outline of the heat sink according to a fifth embodiment of the present disclosure. FIG. 12 is a plan view for describing an outline of the heat sink according to a sixth embodiment of the present disclosure. FIG. 13 is a plan view for describing an outline of the heat sink according to a seventh embodiment of the present disclosure. FIG. 14 is a plan view for describing an outline of the heat sink according to an eighth embodiment of the present disclosure. FIG. 15 is a plan view for describing an outline of the heat sink according to a ninth embodiment of the present disclosure.

As illustrated in FIG. 1, a heat sink 1 according to an embodiment of the present disclosure includes: a heat transport member 10 having a heat receiving portion 41 thermally connected to a heat-generating element 100; a heat radiation fin group 20 which is thermally connected to the heat transport member 10 and in which a plurality of heat radiation fins 21 are arranged; and a tube body 31 thermally connected to the heat radiation fin group 20. The tube body 31 is connected to the heat transport member 10 at a heat radiating portion 42 of the heat transport member 10. Further, the internal space of the heat transport member 10 communicates with the internal space of the tube body 31. In other words, in the heat sink 1, the heat transport member 10 has an integral internal space that communicates from the heat receiving portion 41 to the connection portion with the tube body 31 and is sealed with a working fluid.

As illustrated in FIGS. 1 and 2, the heat transport member 10 includes a container 19 having a hollow cavity portion 13 and a working fluid (not illustrated) that flows through the cavity portion 13. A wick structure 14 having a capillary force is accommodated in the cavity portion 13. The container 19 is formed by stacking one plate-shaped body 11 and the other plate-shaped body 12 that faces the one plate-shaped body 11.

One plate-shaped body 11 has a flat plate shape. The other plate-shaped body 12 is plate-shaped. One plate-shaped body 11 and the other plate-shaped body 12 have a protruding part. The protruding part of one plate-shaped body 11 and the other plate-shaped body 12 forms the cavity portion 13 of the container 19. Therefore, the shape of the container 19 is a planar type. Although the shape of the container 19 is not particularly limited, in the heat transport member 10, a plane view (viewed from a direction perpendicular to the plane portion of the heat transport member 10) has a shape with a different width in the heat transport direction. The cavity portion 13 is an internal space sealed with respect to the external environment, and is decompressed by deaeration processing.

On the outer surface of the container 19, the part to which the heat-generating element 100 which is a cooling target is thermally connected is the heat receiving portion 41, the heat-generating element 100 is thermally connected to the container 19, and accordingly, the heat-generating element 100 is cooled. In the heat transport member 10, since the heat-generating element 100 is thermally connected to one end, a heat receiving portion 41 is formed at one end.

The heat transport member 10 extends in a predetermined direction from the position of the heat-generating element 100, and the heat radiation fins 22 that form the heat radiation fin group 20 are thermally connected to the other end that faces the one end. The other end of the heat transport member 10 to which the heat radiation fin group 20 is thermally connected functions as the heat radiating portion 42 of the heat transport member 10.

The dimension in the width direction of the heat transport member 10 in the heat receiving portion 41 can be appropriately selected according to the dimension in the width direction of the heat-generating element 100, and the like. In the heat transport member 10, an aspect in which the dimension in the width direction of the heat transport member 10 in the heat receiving portion 41 is larger than the dimension in the width direction of the heat transport member 10 at the part (heat radiating portion 42) thermally connected to the heat radiation fin group 20 and the dimension in the width direction of the heat transport member 10 in the heat insulating portion 43, is achieved. In other words, the dimension in the width direction of the heat insulating portion 43 is reduced from the dimension in the width direction of the heat receiving portion 41. Therefore, in the heat sink 1, an increase in space in the heat insulating portion 43 is also prevented. Moreover, the heat receiving portion 41, the heat insulating portion 43, and the heat radiating portion 42 of the heat transport member 10 extend along the same plane. Therefore, it is possible to prevent an increase in dimension in the height direction of the heat sink 1, in particular, dimension in the height direction of the heat receiving portion 41 and the heat insulating portion 43.

In addition, the wick structure 14 extends from one end of the container 19 to the other end. Although the wick structure 14 is not particularly limited, for example, a sintered body of metal powders, such as copper powder, a metal mesh formed of metal wires, a groove (a plurality of fine grooves), a nonwoven fabric, a metal fiber, and the like can be employed. In the heat transport member 10, a sintered body of metal powder is used as the wick structure 14. A part of the cavity portion 13 where the wick structure 14 is not provided functions as a steam flow path 15 through which a gas-phase working fluid flows. The steam flow path 15 extends from one end of the container 19 to the other end corresponding to the wick structure 14 that extends from one end of the container 19 to the other end. The heat transport member 10 transports the heat of the heat-generating element 100 received by the heat receiving portion 41 from the heat receiving portion 41 to the heat radiating portion 42 according to the heat transport characteristics by the operation of the working fluid.

Furthermore, the tube body 31 in which the cavity portion 13 of the container 19 and the internal space communicate with each other is provided at the other end of the heat transport member 10. Therefore, the working fluid that flows through the cavity portion 13 is sealed in a space from the cavity portion 13 to the inside of the tube body 31. Although the shape of the tube body 31 is not particularly limited, in the heat sink 1, the shape in a longitudinal direction is linear, and the shape in the direction orthogonal to the longitudinal direction is circular. In addition, all the tube bodies 31 have the same shape and dimension.

The tube body 31 extends in a direction substantially orthogonal to the heat transport direction of the heat transport member 10 along a plane direction of the heat transport member 10. In this manner, in the heat sink 1, since the extending direction of the tube body 31 is not parallel to the heat transport direction of the heat transport member 10, the heat transported from the heat transport member 10 is transported in a direction different from the extending direction of the heat transport member 10 by the tube body 31. Therefore, since an increase in dimension of the heat sink 1 in the extending direction (heat transport direction) of the heat transport member 10 can be prevented, space saving of the heat sink 1 can be achieved.

In addition, a plurality of tube bodies 31 are provided and extend from the heat transport member 10 in a plurality of directions. In the heat sink 1, the tube body 31 extends in both the left and right directions, that is, in two directions, with the heat transport member 10 as the center. Further, the same number (three) of the tube bodies 31 are provided in both the left and right directions with the heat transport member 10 as the center. Since the plurality of tube bodies 31 extend from the heat transport member 10 in the plurality of directions (two directions in the heat sink 1), the heat transported from the heat transport member 10 is branched and transported in the plurality of directions (two directions in the heat sink 1) different from the extending direction of the heat transport member 10. Therefore, it is possible to more reliably prevent an increase in dimension of the heat sink 1 in the extending direction of the heat transport member 10.

In the tube body 31, an end portion (hereinafter, also referred to as "base portion") on the side of the cavity portion 13 is opened, and an end portion (hereinafter, also referred to as "tip end portion") opposite to the cavity portion 13 is closed. In addition, as illustrated in FIGS. 1 and 3, the cavity portion 13 of the container 19 and the internal space of the tube body 31 communicate with each other, and the internal space of the tube body 31 is depressurized by the deaeration processing in the same manner as the cavity portion 13. Accordingly, the working fluid can flow between the cavity portion 13 of the container 19 and the internal space of the tube body 31.

A through hole (not illustrated) for attaching the tube body 31 to the container 19 is formed in the side surface portion of the container 19. The shape and dimension of the through hole correspond to the shape and dimension of the tube body 31, the base portion of the tube body 31 is fitted to the through hole of the container 19, and accordingly, the tube body 31 is connected to the container 19. Therefore, the tube body 31 and the container 19 are made of different members. A method for fixing the tube body 31 attached to the container 19 is not particularly limited, and examples thereof include welding, soldering, and brazing.

Since the tube body 31 and the container 19 of the heat transport member 10 are made of different members, the arrangement, shape, dimensions and the like of the tube body 31 can be freely selected, and the degree of freedom in designing the heat sink 1 is improved. Further, in the heat sink 1, since the tube body 31 can be attached to the container 19 by fitting and inserting the tube body 31 into the through hole of the container 19, the assembly is easy.

As illustrated in FIG. 3, the other wick structure 34 that is different from the wick structure 14 accommodated in the container 19 and generates a capillary force is provided on the inner surface of the tube body 31. Although the other wick structure 34 is not particularly limited, for example, a sintered body of metal powders, such as copper powder, a metal mesh formed of metal wires, a groove, a nonwoven fabric, a metal fiber, and the like can be employed. In the tube body 31, a plurality of fine grooves formed on the inner surface of the tube body 31 so as to cover the entire inner surface of the tube body 31 are used as the other wick structure 34. The fine groove extends along the longitudinal direction of the tube body 31.

Further, the wick structure 14 provided in the heat transport member 10 is connected to the other wick structure 34 provided in the tube body 31 via a connection member 35. Therefore, the working fluid that has changed in phase from the gas phase to the liquid phase inside the tube body 31 circulates from the tip end portion of the tube body 31 toward base portion in the other wick structure 34 by the capillary force of the other wick structure 34 in the tube body 31, and the liquid-phase working fluid that circulates toward the base portion of the tube body 31 flows from the other wick structure 34 to one end of the connection member 35. The liquid-phase working fluid that has flowed from the other wick structure 34 to one end of the connection member 35 can flows from one end to the other end in the connection member 35, and can circulate from the other end of the connection member 35 to the wick structure 14 of the heat transport member 10.

From the above, the working fluid, which has changed in phase into the liquid phase inside the tube body 31, can smoothly circulate from the tube body 31 to the heat transport member 10 by the connection member 35. Examples of the connection member 35 include a wick member having a capillary force, and specifically include a metal mesh, a braided metal wire, a metal fiber and the like. From above, since the flow characteristics of the liquid-phase working fluid between the tube body 31 and the heat transport member 10 are improved, the cooling performance of the heat sink 1 is improved.

Examples of the material of the container 19 and the tube body 31 include copper, copper alloy, aluminum, aluminum alloy, nickel, nickel alloy, stainless steel, and titanium. The working fluid sealed in the cavity portion 13 of the container 19 and the internal space of the tube body 31 can be appropriately selected according to the compatibility with the material of the container 19 and the tube body 31, and for example, water, fluorocarbons, hydro fluoroether (HFE), cyclopentane, ethylene glycol, a mixture thereof, and the like can be given.

The thickness of the container 19 can be appropriately selected from mechanical strength, weight and the like, but for example, can be 0.5 to 3 mm, and the width of the heat insulating portion 43 can be, for example, 4 to 20 mm. Further, the diameter of the tube body 31 can be appropriately selected from mechanical strength, weight and the like, but for example, can be 5 to 10 mm.

As illustrated in FIG. 1, the heat radiation fin group 20 is formed by arranging the plurality of heat radiation fins 21 and 22 in parallel. The heat radiation fins 21 and 22 are thin flat plate-shaped members. Among these, the heat radiation fins 21 are respectively arranged in parallel at predetermined intervals in a direction substantially parallel to the longitudinal direction of the tube body 31. Therefore, the tube body 31 extends along the arrangement direction of the heat radiation fins 21. Further, the heat radiation fins include the heat radiation fins 21 attached and fixed at the position of the tube body 31 and thermally connected to the tube body 31 and the heat radiation fins 22 attached and fixed at the position of the heat transport member 10 and thermally connected to the heat transport member 10. Out of the heat radiation fin group 20, the heat radiation fins 22 located at the center portion of the heat radiation fin group 20 in the arrangement direction are attached and fixed at the position of the heat transport member 10 and are thermally connected to the heat transport member 10. The heat radiation fins 22 located at the center portion of the heat radiation fin group 20 in the arrangement direction are attached so as to be erected on the heat transport member 10. Meanwhile, out of the heat radiation fin group 20, the heat radiation fins 21 located at both side portions are attached and fixed at the position of the tube body 31 and are thermally connected to the tube body 31. All of the heat radiation fins 21 thermally connected to the tube body 31 have the same shape and dimension.

The main surfaces of the heat radiation fins 21 and 22 are surfaces that mainly exhibit the heat radiation function of the radiation fins 21 and 22. The main surfaces of each of the heat radiation fins 21 and 22 are arranged so as to be in a direction substantially orthogonal to the extending direction of the tube body 31, that is, the longitudinal direction. A cooling air F is supplied from a direction substantially parallel to the heat transport direction of the heat transport member 10. The thermal connection method of the heat radiation fins 21 to the tube body 31 is not particularly limited, and any known method can be used, for example, a method for inserting the tube body 31 into the through hole by forming the through hole in the heat radiation fin 21, a method for bonding by soldering, or the like can be employed. In addition, the thermal connection method of the heat radiation fins 22 to the heat transport member 10 is not particularly limited, and any known method can be used; for example, a method can be employed in which a fixing piece portion extending in a direction perpendicular to the main surface of the heat radiation fin 22 is provided at the end portion of the heat radiation fin 22, the piece portion is connected to the plane of the heat transport member 10, and the heat radiation fins 22 erects on the heat transport member 10.

The heat sink 1 is forcibly air-cooled by a blower fan (not illustrated), for example. The cooling air derived from the blower fan is supplied along the main surfaces of the heat radiation fins 21 and 22 to cool the heat radiation fins 21 and 22.

The material of the heat radiation fins 21 and 22 is not particularly limited, and examples thereof include metals, such as copper, copper alloys, aluminum, and aluminum alloys, carbon materials, such as graphite, and composite members using carbon materials.

Thereafter, a mechanism having a cooling function of the heat sink 1 will be described. First, the heat-generating element 100 which is an object to be cooled is thermally connected to one end (heat receiving portion 41) of the container 19 of the heat transport member 10. When one end of the container 19 receives heat from the heat-generating element 100, the heat is transferred to the liquid-phase working fluid in the cavity portion 13 at one end of the container 19, and the liquid-phase working fluid is changed in phase to the gas-phase working fluid at the cavity portion 13 at one end of the container 19. The gas-phase working fluid flows through the steam flow path 15 from one end of the container 19 to the other end (heat radiating portion 42). As the gas-phase working fluid flows from one end of the container 19 to the other end, the heat transport member 10 transports the heat from the one end to the other end. A part of the gas-phase working fluid that flows to the other end of the container 19 releases latent heat to change in phase into the liquid phase, and the released latent heat is transferred to the heat radiation fin 22 attached and fixed at the position of the heat transport member 10 and thermally connected to the heat transport member 10. The heat transferred to the heat radiation fins 21 thermally connected to the heat transport member 10 is released to the external environment of the heat sink 1 via the heat radiation fins 22. The working fluid that has changed in phase to the liquid phase at the other end of the container 19 circulates to the one end from the other end of the container 19 by the capillary force of the wick structure 14 provided in the heat transport member 10.

Further, since the cavity portion 13 of the container 19 and the internal space of the tube body 31 connected to the side wall portion of the container 19 communicate with each other, among the gas-phase working fluids that have changed in phase from the liquid-phase working fluid, the working fluid that has not changed in phase to the liquid phase at the other end of the container 19 flows into the internal space of the tube body 31 from the cavity portion 13. The gas-phase working fluid that has flowed into the internal space of the tube body 31 releases the latent heat inside the tube body 31 and changes in phase into the liquid-phase working fluid. The latent heat released inside the tube body 31 is transferred to the heat radiation fin 21 attached and fixed to the position of the tube body 31 and thermally connected to the tube body 31. The heat transferred to the heat radiation fins 21 thermally connected to the tube body 31 is released to the external environment of the heat sink 1 via the heat radiation fins 21. The working fluid that has changed in phase from the gas phase to the liquid phase inside the tube body 31 circulates from the center portion and the tip end portion of the tube body 31 to the base portion of the tube body 31 by the capillary force of the other wick structure 34 on the inner surface of the tube body 31. The liquid-phase working fluid that has circulated to the base portion of the tube body 31 circulates to the wick structure 14 provided in the heat transport member 10 via the connection member 35. The liquid-phase working fluid that has circulated to the wick structure 14 provided in the heat transport member 10 circulates to one end of the container 19 by the capillary force of the wick structure 14.

In the heat sink 1 according to the embodiment of the present disclosure, the internal space of the heat transport member 10 is different from the internal space of the heat pipe group in which the plurality of heat pipes are arranged in parallel, and the entire space is integrated in a communicating manner. In addition, in the heat sink 1, the heat transport member 1 transports the heat of the heat-generating element 100 from the heat receiving portion 41 to the heat radiation fin group 20. From above, even when the heat generation amount from the heat-generating element 100 increases, it is possible to equalize the heat input in the heat receiving portion 41 and increase the volume of the heat receiving portion 41, and to prevent an increase in heat resistance in the heat receiving portion 41, and thus, it is possible to exhibit excellent cooling performance with respect to the cooling target. Further, since the entire internal space of the heat transport member 10 is integrated in a communicating manner, even when the heat generation unevenness occurs in the heat-generating element 100, the entire heat-generating element 100 can be uniformly cooled with one heat transport member 10.

Further, in the heat sink 1, since the heat transport member 10 transports the heat of the heat-generating element 100 from the heat receiving portion 41 to the heat radiation fin group 20, while considering the dimension of the heat-generating element 100 and the space dimension in which the heat sink 1 is installed, it is possible to select the dimensions of the heat receiving portion 41 and the heat insulating portion 43 of the heat transport member 10, and thus, the degree of freedom in design is improved.

Further, in the heat sink 1, since the tube body 31 that communicates with the internal space of the heat transport member 10 extends along the arrangement direction of the heat radiation fins 21, the gas-phase working fluid flows along the arrangement direction of the heat radiation fin 21 inside the tube body 31. Therefore, the fin efficiency of the heat radiation fin group 20 is improved, and the cooling performance of the heat sink 1 is improved.

Thereafter, the heat sink according to a second embodiment of the present disclosure will be described with reference to the drawings. In addition, since the main parts of the heat sink according to the second embodiment are the same as those of the heat sink according to the first embodiment, the same components will be described using the same reference numerals.

In the heat sink according to the first embodiment, a planar type heat transport member is used as the heat transport member, but as illustrated in FIGS. 4 to 6, in a heat sink 2 according to the second embodiment, instead of the planar type heat transport member, one heat transport member 50 in which the diameter of the tube body is larger than that of the tube body 31 is used. The heat transport member 50 has a tubular shape, and the heat receiving portion 41 positioned at one end thereof has flattened to have a flat shape. An aspect in which the dimension in the width direction of the heat transport member 50 in the heat receiving portion 41 is larger than the dimension in the width direction of the heat transport member 50 at a part (heat insulating portion 43) to which the tube body 31 is connected, is achieved. In other words, the dimension in the width direction of the heat insulating portion 43 is reduced from the dimension in the width direction of the heat receiving portion 41.

Although the shape in the direction orthogonal to the heat transport direction in the heat insulating portion 43 of the heat transport member 50 is not particularly limited, in the heat sink 2, the shape is circular.

The heat transport member 50 includes a tube-shaped container 59 having a hollow cavity portion and a working fluid (not illustrated) that flows through the cavity portion. A wick structure (not illustrated) having a capillary force is accommodated in the cavity portion. As the wick structure provided in the heat transport member 50, for example, a sintered body of metal powders, such as copper powder, a metal mesh formed of metal wires, a groove, a nonwoven fabric, a metal fiber, and the like can be employed. As the working fluid sealed in the heat transport member 50, for example, water, fluorocarbons, hydro fluoroether (HFE), cyclopentane, ethylene glycol, a mixture thereof, and the like can be given.

In the heat sink 2, no heat radiation fins are attached to the heat transport member 50. Accordingly, the part other than the heat receiving portion 41 including the other end of the heat transport member 50 functions as the heat insulating portion 43. From above, the tube body 31 is connected to the heat transport member 50 at the heat insulating portion 43 of the heat transport member 50. The same number (three) of the tube bodies 31 are provided in both the left and right directions with the heat transport member 50 as the center, and both the dimension and the shape of the heat radiation fin 21 are the same.

In the heat sink 2, the internal space of the heat transport member 50 is also different from the internal space of the heat pipe group in which the plurality of heat pipes are arranged in parallel, and the entire space is integrated in a communicating manner. In addition, in the heat sink 2, the heat transport member 50 transports the heat of the heat-generating element 100 from the heat receiving portion 41 to the connection portion with the tube body 31 thermally connected to the heat radiation fin group 20. From above, even when the heat generation amount from the heat-generating element 100 increases, it is possible to equalize the heat input in the heat receiving portion 41 and increase the volume of the heat receiving portion 41, and to prevent an increase in heat resistance in the heat receiving portion 41, and thus, it is possible to exhibit excellent cooling performance with respect to the cooling target.

Thereafter, the heat sink according to a third embodiment of the present disclosure will be described with reference to the drawings. In addition, since the main parts of the heat sink according to the third embodiment are the same as those of the heat sinks according to the first and second embodiments, the same components will be described using the same reference numerals.

In the heat sink according to the second embodiment, the same number of tube bodies 31 are provided in both the left and right directions with the heat transport member 50 as the center, but as illustrated in FIGS. 7 to 9, in the heat sink 3 according to the third embodiment, different numbers of tube bodies 31 are connected on the right side and the left side with the heat transport member 50 as the center. In the heat sink 3, three tube bodies 31 are arranged in parallel on one side, and two tube bodies 31 are arranged in parallel on the other side.

Further, in the heat sink 3, an aspect in which the surface area of the main surface of the heat radiation fin 21 thermally connected to the tube body 31 on one side is larger than that of the heat radiation fin 21 thermally connected to the tube body 31 on the other side, is achieved. In this manner, according to the usage condition of the heat sink 3 and the installation space, an aspect in which the number of the tube bodies 31 and the dimensions of the heat radiation fins are different on the right side and the left side with the heat transport member 50 as the center, can be achieved.

Thereafter, the heat sink according to a fourth embodiment of the present disclosure will be described with reference to the drawings. In addition, since the main parts of the heat sink according to the fourth embodiment are the same as those of the heat sinks according to the first to third embodiments, the same components will be described using the same reference numerals.

In the heat sink according to the first embodiment, any shape in the direction orthogonal to the longitudinal direction of the tube body 31 is circular, but as illustrated in FIG. 10, in a heat sink 4 according to the fourth embodiment, among the plurality of tube bodies 31, some tube bodies 31 have a shape (flat shape in FIG. 10) other than the circular shape. By making the shape of the tube body 31 flat, a pressure loss of cooling air can be prevented, and the heat transfer characteristics between the tube body 31 and the heat radiation fin 21 thermally connected to the tube body 31 can be improved.

In the heat sink 4, one tube body 31 is disposed in parallel on one side, and three tube bodies 31 are arranged in parallel on the other side. Among these, the tube body 31 on one side has a flat shape.

In addition, in the heat sink according to the first embodiment, the heat radiation fins are also thermally connected to the heat transport member, but in the heat sink 4, the heat radiation fins are not thermally connected to the heat transport member 10. Accordingly, in the heat sink 4, the part other than the heat receiving portion 41 functions as the heat insulating portion 43 including the other end portion.

Thereafter, the heat sink according to a fifth embodiment of the present disclosure will be described with reference to the drawings. In addition, since the main parts of the heat sink according to the fifth embodiment are the same as those of the heat sinks according to the first to fourth embodiments, the same components will be described using the same reference numerals.

In the heat sink according to the first embodiment, the tube bodies are provided on both the left and right sides with the heat transport member as the center, but as illustrated in FIG. 11, in a heat sink 5 according to the fifth embodiment, the tube bodies 31 are provided only on one side of the heat transport member 10. In addition, according to the tube body 31 being provided only on one side of the heat transport member 10, the heat radiation fin group 20 including the plurality of heat radiation fins 21 is disposed only on one side of the heat transport member 10.

In addition, in the heat sink according to the first embodiment, the heat radiation fins are also thermally connected to the heat transport member, but as illustrate in FIG. 11, in the heat sink 5, the heat radiation fins are not thermally connected to the heat transport member 10. Accordingly, in the heat sink 5, the part other than the heat receiving portion 41 functions as the heat insulating portion 43.

In addition, in the heat transport member of the heat sink according to the first embodiment, an aspect in which the dimension in the width direction of the heat transport member in the heat receiving portion is larger than the dimension in the width direction of the heat transport member in the heat insulating portion is achieved, but as illustrated in FIG. 11, in the heat sink 5 according to the fifth embodiment, the dimension in the width direction of the heat transport member 10 in the heat receiving portion 41 is equal to the dimension in the width direction of the heat transport member 10 in the heat insulating portion 43.

In the heat sink 5, the internal space of the heat transport member 10 is also different from the internal space of the heat pipe group in which the plurality of heat pipes are arranged in parallel, and the entire space is integrated in a communicating manner. In addition, in the heat sink 5, the heat transport member 10 transports the heat of the heat-generating element from the heat receiving portion 41 to the connection portion with the tube body 31 thermally connected to the heat radiation fin group 20. From above, even when the heat generation amount from the heat-generating element increases, it is possible to equalize the heat input in the heat receiving portion 41 and increase the volume of the heat receiving portion 41, and to prevent an increase in heat resistance in the heat receiving portion 41, and thus, it is possible to exhibit excellent cooling performance with respect to the cooling target. In addition, according to the usage condition of the heat sink 5 and the installation space, the tube bodies 31 and the heat radiation fins 21 can be installed on one side of the left and right sides with the heat transport member 10 as the center.

Thereafter, the heat sink according to a sixth embodiment of the present disclosure will be described with reference to the drawings. In addition, since the main parts of the heat sink according to the sixth embodiment are the same as those of the heat sinks according to the first to fifth embodiments, the same components will be described using the same reference numerals.

As illustrated in FIG. 12, in a heat sink 6 according to the sixth embodiment, corresponding to the fact that a forbidden region 200, such as an obstacle, is set in an installation region of the heat sink 6, in order to avoid the forbidden region 200 a relief portion 60 is formed in the planar type heat transport member 10. For the heat transport member of the heat sink according to the first embodiment, the relief portion 60 can be formed by reducing the thickness of a predetermined part that corresponds to the obstacle 200 or by increasing the thickness of a part other than the predetermined portion.

In the heat sink 6, the relief portion 60 is formed in the heat insulating portion 43. Therefore, the thickness of the heat insulating portion 43 is thinner than the thickness of the heat receiving portion 41. The shape of the relief portion 60 can be appropriately selected according to the position and shape of the obstacle 200 and the like, and the heat sink 6 has a stepped shape.

In this manner, even when the forbidden region 200, such as an obstacle, is set in the installation region of the heat sink 6, by appropriately designing the shape of the heat transport member 10, the heat sink 6 can be installed in a desired place.

Thereafter, the heat sink according to a seventh embodiment of the present disclosure will be described with reference to the drawings. In addition, since the main parts of the heat sink according to the seventh embodiment are the same as those of the heat sinks according to the first to sixth embodiments, the same components will be described using the same reference numerals.

As illustrated in FIG. 13, in a heat sink 7 according to the seventh embodiment, a part to which the tube body 31 is connected is formed thick in the heat insulating portion 43 of the planar type heat transport member 10. In the heat sink 7, a stepped portion 61 is formed in the heat insulating portion 43.

In the heat insulating portion 43, the part to which the tube body 31 is connected is formed thick, and thus, the position of the tube body 31 can be set higher than the heat receiving portion 41. Since the position of the tube body 31 is set higher than the heat receiving portion 41, the tube body 31 can be easily attached to the center portion of the main surface of the heat radiation fin 21 even when there is a restriction region below the heat radiation fin group 20. Therefore, by appropriately designing the shape of the heat transport member 10 according to a region where the heat radiation fin group 20 can be installed, the excellent heat radiating efficiency of the heat radiation fin group 20 is maintained, and excellent cooling characteristics are imparted to the heat sink 7.

Thereafter, the heat sink according to an eighth embodiment of the present disclosure will be described with reference to the drawings. In addition, since the main parts of the heat sink according to the eighth embodiment are the same as those of the heat sinks according to the first to seventh embodiments, the same components will be described using the same reference numerals.

In the heat sink according to the first embodiment, the tube body extends in the direction substantially orthogonal to the heat transport direction of the planar type heat transport member along the plane direction of the planar type heat transport member, but as illustrated in FIG. 14, in a heat sink 8 according to the eighth embodiment, the tube body 31 extends in a direction substantially orthogonal to the plane direction of the planar type heat transport member 10 and in a direction substantially orthogonal to the heat transport direction of the planar type heat transport member 10.

In the heat sink 8, in a case where the cooling air F is supplied mainly above the heat sink 8, excellent cooling characteristics are imparted to the heat sink 8. In this manner, in the heat sink of the present disclosure, the position of the tube body 31 and the heat radiation fin group 20 thermally connected to the tube body 31 can be appropriately set according to the position of the supply flow path of the cooling air F and the position of the region where the heat sink can be installed.

Thereafter, the heat sink according to a ninth embodiment of the present disclosure will be described with reference to the drawings. In addition, since the main parts of the heat sink according to the ninth embodiment are the same as those of the heat sinks according to the first to eighth embodiments, the same components will be described using the same reference numerals.

In the heat sink according to the first embodiment, the tube body extends in the direction substantially orthogonal to the heat transport direction of the planar type heat transport member along the plane direction of the planar type heat transport member, but as illustrated in FIG. 15, in a heat sink 9 according to the ninth embodiment, the tube body 31 extends along a plane direction of the planar type heat transport member 10 and along the heat transport direction of the planar type heat transport member 10. Therefore, in the heat sink 9, the extending direction of the tube body 31 is substantially parallel to the heat transport direction of the heat transport member 10.

In the heat sink 9, in a case where the cooling air F is supplied in a plane direction of the planar type heat transport member of the heat sink 9 and a direction substantially orthogonal to the heat transport direction of the planar type heat transport member, excellent cooling characteristics are imparted to the heat sink 9. In this manner, in the heat sink of the present disclosure, the position of the tube body 31 and the heat radiation fin group 20 thermally connected to the tube body 31 can be appropriately set according to the position of the supply flow path of the cooling air F and the position of the region where the heat sink can be installed.

In addition, in the heat transport member of the heat sink according to the first embodiment, an aspect in which the dimension in the width direction of the heat transport member in the heat receiving portion is larger than the dimension in the width direction of the heat transport member in the heat insulating portion is achieved, but as illustrated in FIG. 15, in the heat sink 9 according to the ninth embodiment, the dimension in the width direction of the heat transport member 10 in the heat insulating portion 43 is larger than the dimension in the width direction of the heat transport member 10 in the heat receiving portion 41. In other words, the width of the connection part of the tube body 31 to the heat transport member 10 is wider than the width of the heat receiving portion 41 of the heat transport member 10.

In this manner, in the heat sink of the present disclosure, the dimension of the part of the heat transport member 10 to which the tube body 31 is connected can be selected without changing the width of the heat receiving portion 41 according to the dimensions of the heat radiation fins 21, the diameter and the number of the tube bodies 31, and the like.

Thereafter, the other embodiments of the heat sink of the present disclosure will be described below. In the heat sink of each of the above-described embodiments, the shape of the tube body in the longitudinal direction is linear, but instead, the shape may be a shape having a bent portion, such as an L shape. In addition, in the heat sinks according to the first to eighth embodiments, the dimension in the width direction of the heat transport member in the heat receiving portion is equal to or larger than the dimension in the width direction of the heat transport member in the heat insulating portion, but instead, the dimension in the width direction of the heat transport member in the heat receiving portion may be less than the dimension in the width direction of the heat transport member in the heat insulating portion.

Even when the heat generation amount from the heat-generating element increases, the heat sink of the present disclosure can equalize the heat input in the heat receiving portion and increase the volume of the heat receiving portion, and to prevent an increase in heat resistance in the heat receiving portion, and thus, it is possible to exhibit excellent cooling performance with respect to the cooling target. From above, the heat sink of the present disclosure is highly useful in the field of cooling, for example, an electronic component having a high heat generation amount, for example, an electronic component such as a central processing unit installed in a small space.

What is claimed is:
1. A heat sink comprising:
a heat transport member having a heat receiving portion thermally connected to a heating element;
a tube body connected to a heat insulating portion or a heat radiating portion of the heat transport member; and a heat radiation fin group which is thermally connected to the tube body and in which a plurality of heat radiation fins are arranged, wherein the heat transport member has an integral internal space that communicates from the heat receiving portion to a connection portion with the tube body and is sealed with a working fluid, and the internal space of the heat transport member communicates with an internal space of the tube body, a wick structure provided on the heat transport member is connected to a wick structure provided in the tube body via a connection member that is a wick member having a capillary force, and the wick structure provided on the heat transport member, the wick structure provided in the tube body, and the wick member are different in type from each other, and the wick structure provided in the tube body is a plurality of fine grooves formed in an inner surface of the tube body.

2. The heat sink according to claim 1, wherein the tube body extends along an arrangement direction of the heat radiation fins.

3. The heat sink according to claim 1, wherein an extending direction of the tube body is not parallel to a heat transport direction of the heat transport member.

4. The heat sink according to claim 1, wherein a plurality of the tube bodies are provided and extend from the heat transport member in a plurality of directions.

5. The heat sink according to claim 1, wherein an extending direction of the tube body is parallel to a heat transport direction of the heat transport member.

6. The heat sink according to claim 1, wherein
a dimension in a direction orthogonal to a heat transport direction of the heat transport member in the heat receiving portion is larger than a dimension in the direction orthogonal to a heat transport direction of the heat transport member at a part to which the tube body is connected.

7. The heat sink according to claim 1, wherein at least one surface of the heat transport member has a planar shape.

8. The heat sink according to claim 1, wherein the heat receiving portion of the heat transport member has a flat shape.

* * * * *